United States Patent
Banine et al.

(10) Patent No.: US 6,714,279 B2
(45) Date of Patent: Mar. 30, 2004

(54) LITHOGRAPHIC PROJECTION APPARATUS, DEVICE MANUFACTURING METHOD AND DEVICE MANUFACTURED THEREBY

(75) Inventors: Vadim Y. Banine, Helmond (NL); Jeroen Jonkers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/942,952

(22) Filed: Aug. 31, 2001

(65) Prior Publication Data

US 2002/0051123 A1 May 2, 2002

(30) Foreign Application Priority Data

Sep. 4, 2000 (EP) ............................... 00307593

(51) Int. Cl.⁷ ...................... G03B 27/52; G03B 27/42
(52) U.S. Cl. ................... 355/30; 355/53; 355/77
(58) Field of Search ................ 355/30, 53, 77

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 6,369,874 B1 * | 4/2002 | del Puerto | 250/492.2 |

FOREIGN PATENT DOCUMENTS

| | | |
|---|---|---|
| EP | WO 99/57596 | 11/1999 |
| EP | WO 00/36471 | 6/2000 |
| EP | 1037113 | 9/2000 |
| EP | WO 98/40791 | 7/2001 |

* cited by examiner

*Primary Examiner*—Rodney Fuller
(74) *Attorney, Agent, or Firm*—Pillsbury Winthrop LLP

(57) ABSTRACT

A lithographic projection apparatus comprising a radiation system for supplying a projection beam of radiation, a mask table for holding a mask, a substrate table for holding a substrate and a projection system for imaging an irradiated portion of the mask onto a target portion of the substrate. Either or both of the radiation system and the projection system is supplied with an inert gas at a pressure of from 0.1 to 10 Pa in order to suppress contamination, for example by hydrocarbon molecules, of any optical components in the system(s).

15 Claims, 2 Drawing Sheets

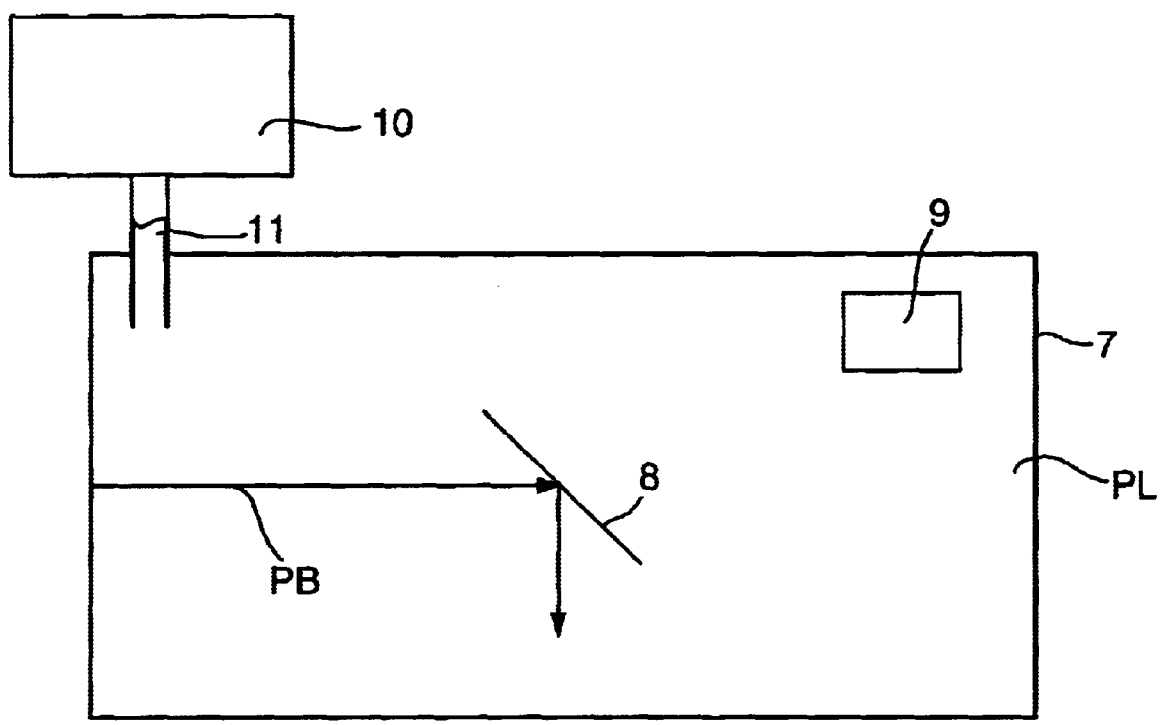

LITHOGRAPHIC PROJECTION APPARATUS, DEVICE MANUFACTURING METHOD AND DEVICE MANUFACTURED THEREBY

BACKGROUND OF THE INVENTION

1. Field of the Invention

The present invention relates generally to a lithographic projection apparatus and more particularly to a lithographic projection apparatus including a system for suppression of contamination of the optical system.

2. Background of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In the case of the current invention, the projection system will generally consist of an array of mirrors, and the mask will be reflective; see, for example, the apparatus discussed in WO 99/57596. The radiation in this case is preferably electromagnetic radiation in the extreme ultraviolet (EUV) range, which may be produced by a plasma source. Typically, the radiation has a wavelength below about 50 nm, preferably below about 20 nm and most preferably below about 15 nm. An example of a wavelength in the EUV region which is gaining considerable interest in the lithography industry is 13.4 nm, though there are also other promising wavelengths in this region, such as 11 nm, for example.

An example of the radiation system suitable for use with such radiation is described in WO 00/36471. Such a radiation system may comprise a suitable condenser for use with EUV as described in EP 1037113.

It is well known that contaminant particles, such as hydrocarbon molecules and water vapor, are present in lithographic projection apparatus. These contaminant particles may include debris and by-products that are sputtered loose from the substrate, for example by an EUV radiation beam. Said particles may also include debris from the EUV source, contaminants liberated at actuators, conduit cables, etc. Since parts of lithographic projection apparatus, such as the radiation system and the projection system, are generally at least partially evacuated, these contaminant particles tend to migrate to such areas. The particles then adsorb to the surfaces of the optical components located in these areas. This contamination of the optical components causes a loss of reflectivity, which may adversely affect the accuracy and efficiency of the apparatus, and may also degrade the components' surfaces, thus reducing their useful lifetime.

Previous measures which have been proposed to remove impurities from the apparatus have involved suppressing the movement towards the projection system of debris produced by the sputtering of the surface of the substrate. For example, it has previously been suggested that the problem can be addressed by increasing the distance between the substrate and the final optical component, by introducing a "gas curtain" between the substrate and the final optical component to sweep away the debris. Such measures are directed to preventing contaminants from entering, for instance, the projection system. However, some contaminants may still enter the system or may be generated in the system itself, e.g. by moving parts.

SUMMARY OF THE INVENTION

One aspect of embodiments of the present invention provides a lithographic apparatus in which contamination of optical components is suppressed thereby addressing the problems of the previously used systems as described above.

According to one embodiment of the invention there is provided a lithographic projection apparatus wherein that a space containing at least a part of a radiation system, and/or a space containing at least a part of a projection system contains an inert gas at a pressure of 0.1 to 10 Pa.

By introducing an inert gas into either or both of the radiation or the projection system, the mean free path of any contaminant particles contained in the system is reduced. This has the effect of suppressing the contamination of any optical components, such as mirrors, located in the radiation and/or projection systems. The contamination of such optical components can be suppressed by a factor of about 10 to $10^3$ using this method. Thus, the mirror surfaces are protected and the decrease in their reflectance over time is reduced, thereby increasing their useful lifetime.

The invention also relates to a method of manufacturing a device using a lithographic projection apparatus including providing a substrate that is at least partially covered by a layer of radiation-sensitive material, providing a projection beam of radiation using a radiation system, using patterning structure to endow the projection beam with a pattern in its cross-section, projecting the patterned beam of radiation onto a target portion of the layer of radiation-sensitive material, and supplying an inert gas to a space containing at least a part of said radiation system and/or a space containing at least a part of said projection system, wherein the pressure in said space(s) is from 0.1 to 10 Pa.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface, rather than implying any particular orientation of the apparatus.

BRIEF DESCRIPTION OF THE DRAWINGS

The invention and its attendant advantages will be further described below with reference to exemplary embodiments and the accompanying schematic drawings, wherein:

FIG. 3 depicts the projection system of the invention in more detail.

In the drawings, like parts are identified by like references.

DETAILED DESCRIPTION

Embodiment 1

Figure 1:
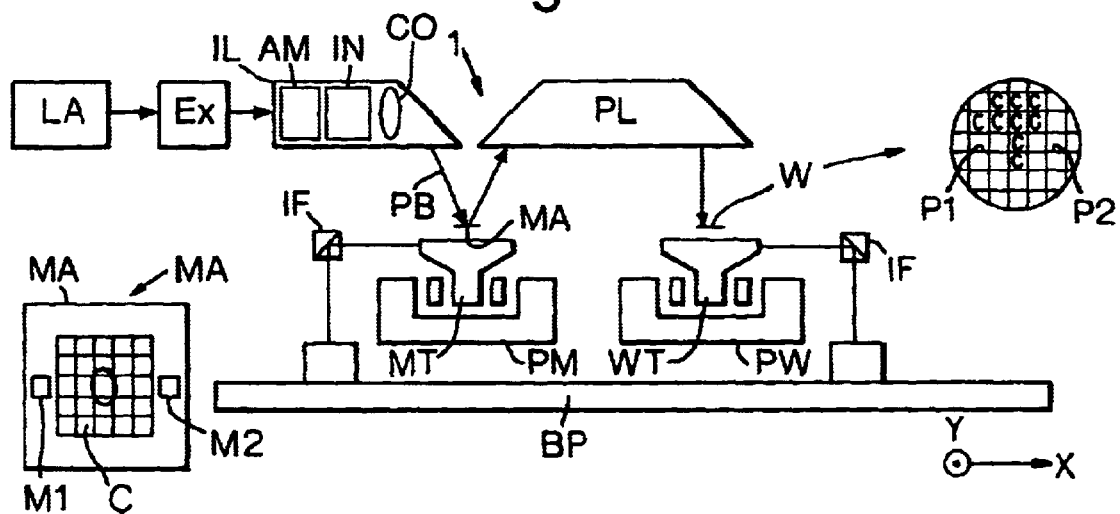
FIG. 1 depicts a lithographic projection apparatus according to the invention.

FIG. 1 schematically depicts a lithographic projection apparatus according to a particular embodiment of the invention. The apparatus comprises:

a radiation system Ex, IL, for supplying a projection beam PB of radiation (e.g. EUV radiation). In this particular case, the radiation system also comprises a radiation source LA;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL;

a projection system ("lens") PL (eg. a mirror group) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. an undulator or wiggler provided around a path of an electron beam in a storage ring or synchrotron, a laser-produced plasma source or a discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, eg. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
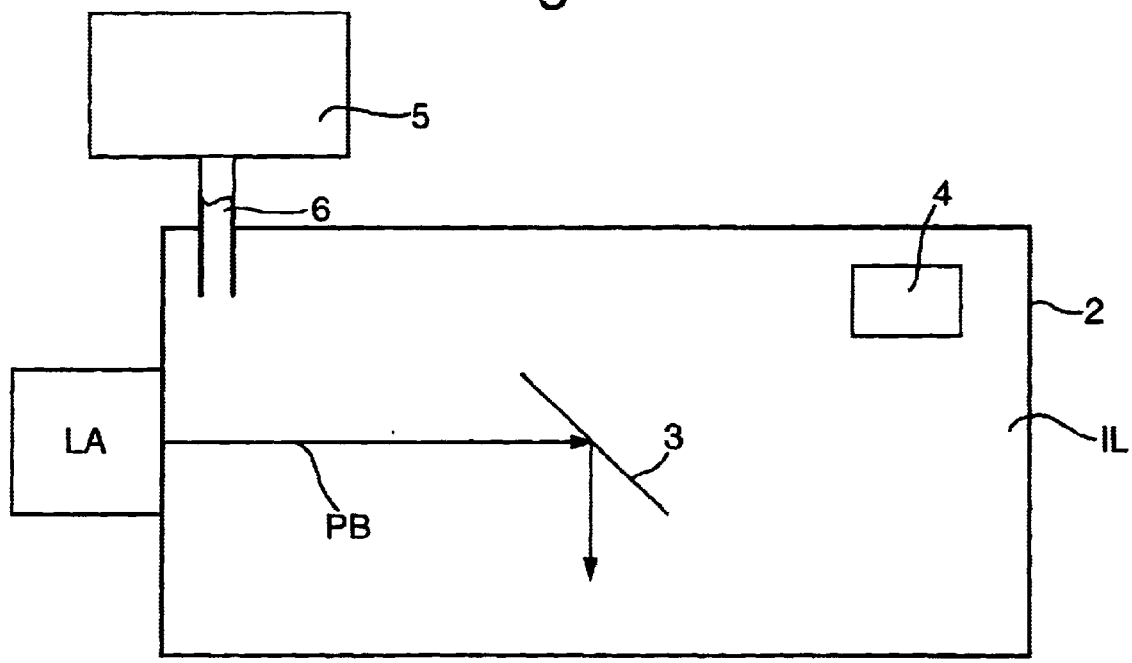
FIG. 2 depicts the illumination system of the invention in more detail.

FIG. 2 shows the illumination system of a specific case of the invention in more detail. In this case, an inert gas is supplied to the entire illumination system to suppress the contamination of optical components in this area. The illumination system IL, which comprises a mirror 3 and optionally various other optical components as described above with reference to FIG. 1, is contained within a chamber 2. The chamber is supplied with an inert gas from inert gas supply 5, which may be a pressurized container containing a gaseous or liquid inert gas. The inert gas may be any chemically inert gas such as a noble gas, for example helium, neon, argon, krypton or xenon, or it may be nitrogen or a mixture of any of these gases. The inert gas is preferably one or a mixture of helium, argon or nitrogen, since these gases have a relatively high transparency to radiation in the extreme ultraviolet range. The inert gas is supplied to the chamber 2 via inlet 6, which comprises a valve.

The pressure within the chamber 2 is monitored using pressure sensor means 4. The partial pressure of inert gas in the chamber is adjusted using the valve such that the total pressure within the chamber remains within the range 0.1 to 10 Pa, preferably 1 to 5 Pa, more preferably 2 to 3 Pa.

FIG. 3 shows the projection system of a specific case of the invention in more detail. In this case, an inert gas is supplied to the entire projection system to suppress the contamination of optical components in this area. The projection system PL, which comprises a mirror 8 and optionally various other optical components as described above with reference to FIG. 1, is contained within a chamber 7. The chamber is supplied with an inert gas from inert gas supply 10, which may be a pressurized container containing a gaseous or liquid inert gas. The inert gas may be any chemically inert gas such as those described above with reference to FIG. 2. The inert gas is supplied to the chamber 7 via inlet 11, which comprises a valve.

The pressure within the chamber 7 is monitored using pressure sensor means 9. The partial pressure of inert gas in the chamber is adjusted using the valve such that the total pressure within the chamber remains within the range 0.1 to 10 Pa, preferably 1 to 5 Pa, more preferably 2 to 3 Pa.

In a further specific case of the present invention, the illumination system and the projection system are contained within two separate chambers and each chamber is supplied with an inert gas as described above with reference to FIGS. 2 and 3.

The introduction of a low pressure of an inert gas into the chambers 2 and 7 has the effect of decreasing the mean free path of any contaminant particles such as hydrocarbon molecules or water vapor which are present in the chamber. Tn a chamber evacuated to a pressure of $10^{-1}$ Pa or less, the mean free path of such particles is larger, than the typical dimension of such chamber. The flux of the particles towards an optical component, such as a mirror, in the chamber is therefore determined by direct molecular bombardment of the component's surface. The molecule flux can be calculated using the following equation:

$$\text{Molecular flux} = \frac{n_{CH_x} v}{4}$$

Where $n_{CH_x}$ is the contaminant concentration (largely made up of hydrocarbons, but it may also be water, for example) and V is the mean velocity of the contaminant particles.

By introducing an inert gas into the chamber at a pressure of 0.1 to 10 Pa, the mean free path of the contaminant particles is decreased and the flux of the particles towards the optical component is now determined by diffusion. The diffusion flux can be calculated as follows:

$$\text{Diffusion flux} = D \frac{n_{CH_x}}{l}$$

where D, the diffusion coefficient, is determined by $$D = \frac{kTv}{3\sigma p},$$

l is the characteristic size of the vacuum chamber, Y is the diffusion cross section, p is the background pressure in the chamber and k is the Boltzmann's constant. σ can be calculated using a known diffusion coefficient for Ar-CH$_x$ mixtures at a given T and p. v, the mean velocity of the molecules in the mixture can in this case be calculated using:

$$v = \sqrt{\frac{8kT}{\pi M}}$$

Where M is the mass of a molecule in the mixture.

The degree by which the introduction of inert gas into the chamber suppresses contamination of an optical component can be considered in terms of a suppression factor which is calculated as follows:

$$\text{Suppression factor} = \frac{\text{Molecular flux}}{\text{Diffusion flux}} = \frac{lv}{4D} = \frac{3lp\sigma}{4kT}$$

It can be determined from this equation that the suppression of contamination is increased when the contaminant particles are larger or when the background pressure is increased. However, an increased pressure of inert gas in the chamber will result in a decreased transparency to EUV radiation and will therefore decrease the efficiency of the system. Although this effect is less important for gases such as helium, argon and nitrogen, which are highly transparent to EUV radiation, there is still a significant difference in the transparency of these gases to EUV radiation with an increase in pressure. Thus, the pressure of the inert gas should be kept at or below 10 Pa, advantageously at or below 3 Pa.

While we have described above specific embodiments of the invention it will be appreciated that the invention may be practiced otherwise than described. The description is not intended to limit the invention.

What is claimed is:

1. A lithographic projection apparatus comprising:
   a radiation system to supply a projection beam of radiation;
   a support structure to support patterning structure, the patterning structure serving to pattern the projection beam according to a desired pattern;
   a substrate table to hold a substrate; and
   a projection system disposed in an optical path between said patterning structure and said substrate table to project the patterned beam onto a target of the substrate,
   wherein a space containing at least part of said projection system is at a pressure of about 0.1 to 10 Pa and contains argon, nitrogen, helium or a mixture thereof.

2. An apparatus according to claim 1, wherein said radiation system is adapted to produce a projection beam of extreme ultraviolet radiation having a wavelength of less than 50 nm.

3. An apparatus according to claim 2, wherein said beam of extreme ultraviolet radiation has a wavelength in the range of from 8 to 20 nm.

4. An apparatus according to claim 3, wherein said beam of extreme ultraviolet radiation has a wavelength in the range of from 9 to 16 nm.

5. An apparatus according to claim 1, wherein the pressure in said space is from 1 to 5 Pa.

6. An apparatus according to claim 5, wherein the pressure in said space is from 2 to 3 Pa.

7. An apparatus according to claim 1, further comprising an illumination system wherein a space containing at least part of said illumination system is at a pressure of about 0.1 to 10 Pa and contains argon, nitrogen, helium or a mixture thereof.

8. An apparatus according to claim 7, wherein the space containing the part of the illumination space is supplied with a continuous flow of argon, nitrogen, helium or a mixture thereof.

9. An apparatus according to claim 8, wherein the pressure in the space containing the part of the illumination system is from 1 to 5 Pa.

10. An apparatus according to claim 9, wherein the pressure in the space containing the part of the illumination system is from 2 to 3 Pa.

11. An apparatus according to claim 1, wherein the space containing the part of the projection system is supplied with a continuous flow of argon, nitrogen, helium or a mixture thereof.

12. An apparatus according to claim 11, wherein the pressure m the space containing the part of the projection system is from 1 to 5 Pa.

13. An apparatus according to claim 12, wherein the pressure in the space containing the part of the projection system is from 2 to 3 Pa.

14. A method of manufacturing a device using a lithographic projection apparatus comprising:
   projecting a patterned beam of radiation onto a target portion of a layer of radiation-sensitive material on a substrate with a projection system, said projection system being disposed in an optical path between a patterning structure and said substrate; and
   supplying a continuous flow of argon, nitrogen, helium or a mixture thereof to a space containing at least a part of said projection system, wherein the pressure in said space is from 0.1 to 10 Pa.

15. A semiconductor device manufactured in accordance with a method comprising:
   projecting a patterned beam of radiation onto a target portion of a layer of radiation-sensitive material on a substrate with a projection system, said projection system being disposed in an optical path between a patterning structure and said substrate; and
   supplying a continuous flow of argon, nitrogen, helium or a mixture thereof to a space containing at least a part of said projection system, wherein the pressure in said space is from 0.1 to 10 Pa.

* * * * *